United States Patent [19]
Suzuki

[11] Patent Number: 6,150,615
[45] Date of Patent: Nov. 21, 2000

[54] ECONOMICAL PACKAGE WITH BUILT-IN END RESISTOR USED FOR SEMICONDUCTOR DEVICE AND PROCESS OF FABRICATION

[75] Inventor: Katsunobu Suzuki, Tokyo, Japan

[73] Assignee: NEC Corporation, Tokyo, Japan

[21] Appl. No.: 09/071,194

[22] Filed: May 4, 1998

[30] Foreign Application Priority Data

May 2, 1997 [JP] Japan .................................. 9-130249

[51] Int. Cl.⁷ .............................. H05K 1/16; H01L 23/02

[52] U.S. Cl. ........................ 174/260; 174/255; 174/261; 174/264; 174/52.1; 257/666; 257/698; 257/774; 361/783; 361/799

[58] Field of Search ................................. 174/52.1, 52.2, 174/52.3, 52.4, 259, 260, 261, 262, 255, 264, 265; 257/666, 698, 723, 724, 774; 361/748, 777, 783, 790, 799, 803, 807

[56] References Cited

U.S. PATENT DOCUMENTS

| | | | |
|---|---|---|---|
| 5,122,620 | 6/1992 | Neumann et al. | 174/52.4 |
| 5,866,942 | 2/1999 | Suzuki et al. | 257/698 |
| 5,889,325 | 3/1999 | Uchida et al. | 257/724 |

FOREIGN PATENT DOCUMENTS

| | | |
|---|---|---|
| 4-74461 | 3/1992 | Japan . |
| 10-41434 | 7/1996 | Japan . |

*Primary Examiner*—Hyung Sub Sough
*Attorney, Agent, or Firm*—Sughrue, Mion, Zinn, Macpeak & Seas, PLLC

[57] ABSTRACT

A lead frame used for a semiconductor chip has built-in end resistors accurately patterned through lithographic techniques and an etching from a conductive bonding layer between an insulating film and a conductive metallic foil, the conductive metallic foil is patterned into a conductive island for a semiconductor chip and conductive strips for electric signals, and the built-in end resistors achieve impedance matching for the electric signals.

13 Claims, 12 Drawing Sheets

ECONOMICAL PACKAGE WITH BUILT-IN END RESISTOR USED FOR SEMICONDUCTOR DEVICE AND PROCESS OF FABRICATION

FIELD OF THE INVENTION

This invention relates to a semiconductor device and, more particularly, to a package with a built-in end resistor used for a semiconductor device and a process of fabrication thereof.

DESCRIPTION OF THE RELATED ART

Reflection of signal is causative of distortion in a signal waveform and, accordingly, a malfunction, and an end resistor is effective against the influence of the distortion. The distortion is serious to a high speed integrated circuit device, and a discrete resistor element was connected to the high speed integrated circuit device as the end resistor. However, the discrete resistor element made the circuit configuration complicated, and a package with a built-in end resistor has been proposed.

The package with a built-in end resistor was disclosed in Japanese Patent Application No. 8-195925 filed in 1996, and the applicant of the Japanese Patent Application was NEC Corporation. Although the specification for the Japanese Patent Application had not been published before the priority date of the present U.S. Application, the present inventor was an employee of NEC Corporation, and knew the package disclosed in the Japanese Patent Application.

FIG. 1 illustrates the package disclosed in the Japanese Patent Application. The package includes a conductive metal plate 1, and the major surface of the conductive metal plate 1 is covered with an insulating film 2. Via-holes are formed in the insulating film 2, and conductive pieces 3/4 fill the via-holes. An island 5 and a wiring pattern 6 are formed on the upper surface of the insulating film 2, and are spaced from one another. A resistive element 7 is formed on a predetermined area on the insulating film 2, and is connected at one end thereto to the island 5 and at the other end to the wiring pattern 6. A semiconductor chip 8 is bonded to the island 5, and the ground voltage is applied to the island 5. The resistive element 7 is close to the semiconductor chip 8, and is effective against the signal reflection.

The package is fabricated as follows. The resistive element 7 is formed on the predetermined area on the insulating film 2 by using a thin film depositing technique or a plating technique, and a metallic foil is clad on the resistive element 7 and the insulating film 2. The metallic foil is selectively etched away so as to not only leave the island 5 and the wiring pattern 6 but also expose the resistive element 7.

FIG. 2 illustrates the structure of a prior art lead frame disclosed in Japanese Patent Publication of Unexamined Application (JPA) No.4-74461. The prior art lead frame includes a ground plane 11, and a semiconductor chip 12 is bonded to a predetermined area of the major surface of the ground plane 11. Another area of the major surface is assigned to an inner lead 13, and is spaced from the predetermined area assigned to the semiconductor chip 12. An insulating film 14 is inserted between the ground plane 11 and the inner lead 13, and a part of the insulating film 14 under the leading end of the inner lead 13 is replaced with a conductive film 15. The conductive film 15 provides resistance, and serves as an end resistor.

An integrated circuit is fabricated on the semiconductor chip 12, and the semiconductor chip 12 on the prior art lead frame forms a part of an electric circuit. Using the prior art lead frame, the end resistor achieves the impedance matching before the entry of a signal into the semiconductor chip 12, and is effective against the signal reflection and, accordingly, the distortion of the signal.

The prior art lead frame is fabricated as follows. A conductive member is patterned into the inner lead 13. The insulating film 14 is integral with the conductive film 15, and the insulating film 14 and the conductive film 15 form a file. An insulating material contains rubidium oxide, and the resistive film serves as the conductive film 15. The file is clad, and bonded to the ground plane 11.

The package disclosed in Japanese Patent Application No. 8-195925 encounters a problem in high production cost due to the complicated fabrication process. As described hereinbefore, the resistive element 7 is formed in the predetermined area on the insulating film 2, the metallic foil is clad on the insulating film 2, and the metallic foil is patterned into the island 5 and the wiring pattern 6. Thus, the fabrication process is complicated, and the complicated process increases the production cost. Moreover, the cladding step between the insulating film 2 and the metallic foil requires high positioning accuracy, and such a high accuracy cladding apparatus is expensive.

The prior art lead frame disclosed in Japanese Patent Publication of Unexamined Application No. 4-74461 also encounters a problem in high production cost. The rubidium oxide is evaporated, and the evaporation is costly. Moreover, the manufacturer is expected to accurately clad the file on the ground plane, and a high accurate cladding machine increases the production cost. Another problem is low patternability, and it is impossible to achieve a fine pitch.

SUMMARY OF THE INVENTION

It is therefore an important object of the present invention to provide a package with a built-in end resistor which is low in production cost and high in accuracy.

It is another important object of the present invention to provide a process of fabricating the package.

In accordance with one aspect of the present invention, there is provided a package used for a semiconductor device comprising an insulating layer having a first surface and a second surface reverse to the first surface, a conductive island formed over the first surface, a conductive pattern formed over the first surface, spaced from the conductive island and having at least one conductive strip assigned to an electric signal, a conductive bonding layer provided between the first surface and the conductive pattern for bonding the conductive pattern to the insulating layer and having a portion connected between the at least one conductive strip and a constant potential source so as to serve as an end resistor, a ground plane fixed to the second surface and applied with a constant potential, at least one connector fixed to the second surface, and spaced from the ground plane, and conductive plugs respectively formed in through-holes, and connected between the conductive island and the ground plane and between the at least one conductive strip and the at least one connector.

In accordance with another aspect of the present invention, there is provided a process of fabricating a package for a semiconductor device comprising the steps of preparing a four layered structure including a conductive metallic plate, an insulating layer laminated on the conductive metallic plate, a conductive bonding layer formed on the insulating layer and a conductive metallic foil laminated on the conductive bonding layer, forming openings passing through the conductive metallic foil, the conductive bonding layer and the insulating layer so as to expose the conductive metallic plate to the openings, filling the openings with conductive pieces so as to electrically connect the conductive metallic foil and the conductive bonding layer to the conductive metallic plate, patterning the conductive metallic foil into a conductive island and a conductive pattern having at least one conductive strip so that a part of the conductive bonding layer is exposed to a gap between the conductive island and the at least one conductive strip, patterning the conductive bonding layer so that the at least one conductive strip is electrically connected to the conductive island through a portion of the conductive bonding layer serving as an end resistor, and patterning the conductive metallic plate into a ground plane connected through certain conductive pieces to the conductive island and at least one connector connected through another conductive piece to the at least one conductive strip.

In accordance with yet another aspect of the present invention, there is provided a process of fabricating a package for a semiconductor device comprising the steps of preparing a four layered structure including a conductive metallic plate, an insulating layer laminated on the conductive metallic plate, a conductive bonding layer formed on the insulating layer and a conductive metallic foil laminated on the conductive bonding layer, selectively removing the conductive metallic foil, the conductive bonding layer and the insulating layer so as to form an aperture and at least one through-hole in the insulating layer, covering the resultant structure of the previous step with a conductive metallic film, patterning the conductive metallic film and the conductive metallic foil so as to form a conductive pattern having at least one conductive strip and a ground pad from the conductive metallic foil, the at least one conductive strip being connected through a first conductive portion formed from the conductive metallic film and located in the at least one through-hole to the conductive metallic plate, the ground pad being connected to a second conductive portion formed from the conductive metallic film extending on a certain area of the conductive metallic plate exposed to the aperture, patterning the conductive bonding layer so as to have an end resistor exposed to a gap between the ground pad and the at least one conductive strip, and patterning the conductive metallic plate into a ground plane and at least one connector, the ground plane being connected through the second conductive portion to the ground pad, the at least one connector being connected through the first conductive portion to the at least one conductive strip.

BRIEF DESCRIPTION OF THE DRAWINGS

The features and advantages of the package and the fabrication process will be more clearly understood from the following description taken in conjunction with the accompanying drawings in which.

DESCRIPTION OF THE PREFERRED EMBODIMENTS

First Embodiment

Figure 1:
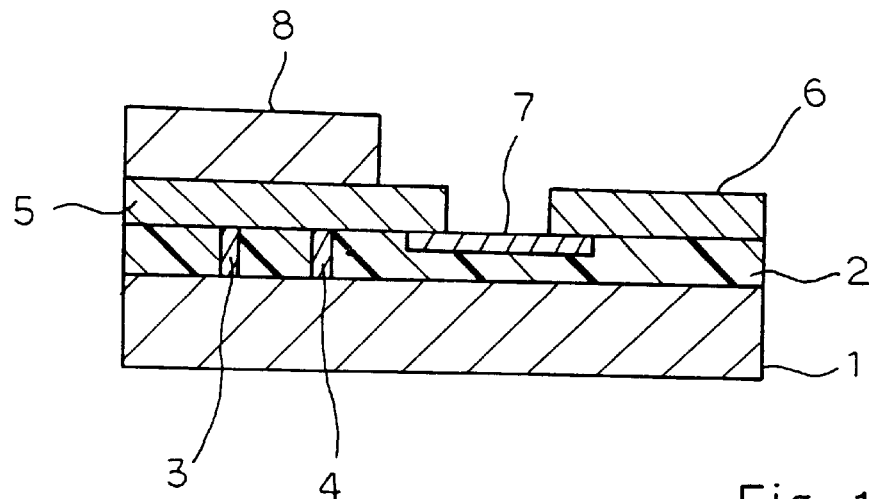
FIG. 1 is a cross sectional view showing the structure of a semiconductor device disclosed in the specification for Japanese Patent Application No. 8-195925.
Figure 2:
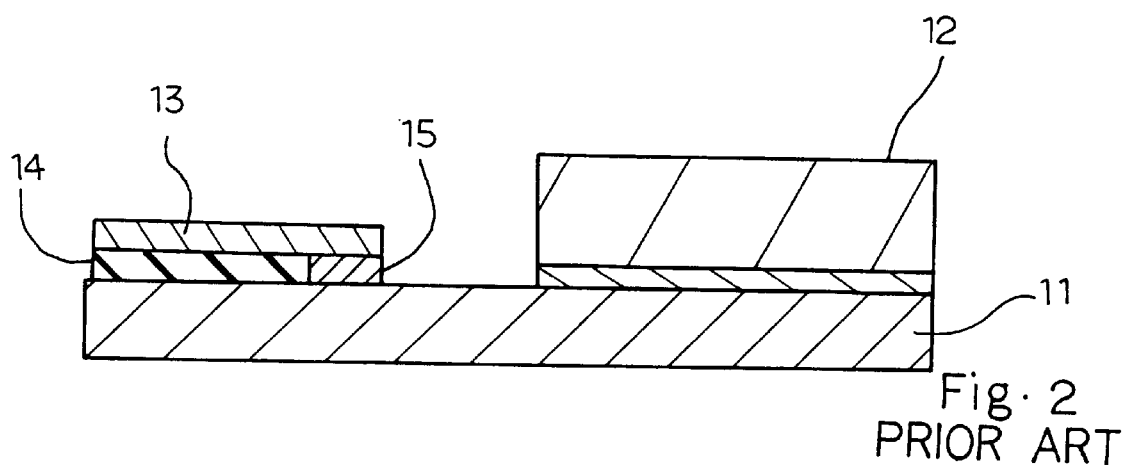
FIG. 2 is a cross sectional view showing the prior art semiconductor device disclosed in Japanese Patent Publication of Unexamined Application No. 4-74461.
Figure 3:
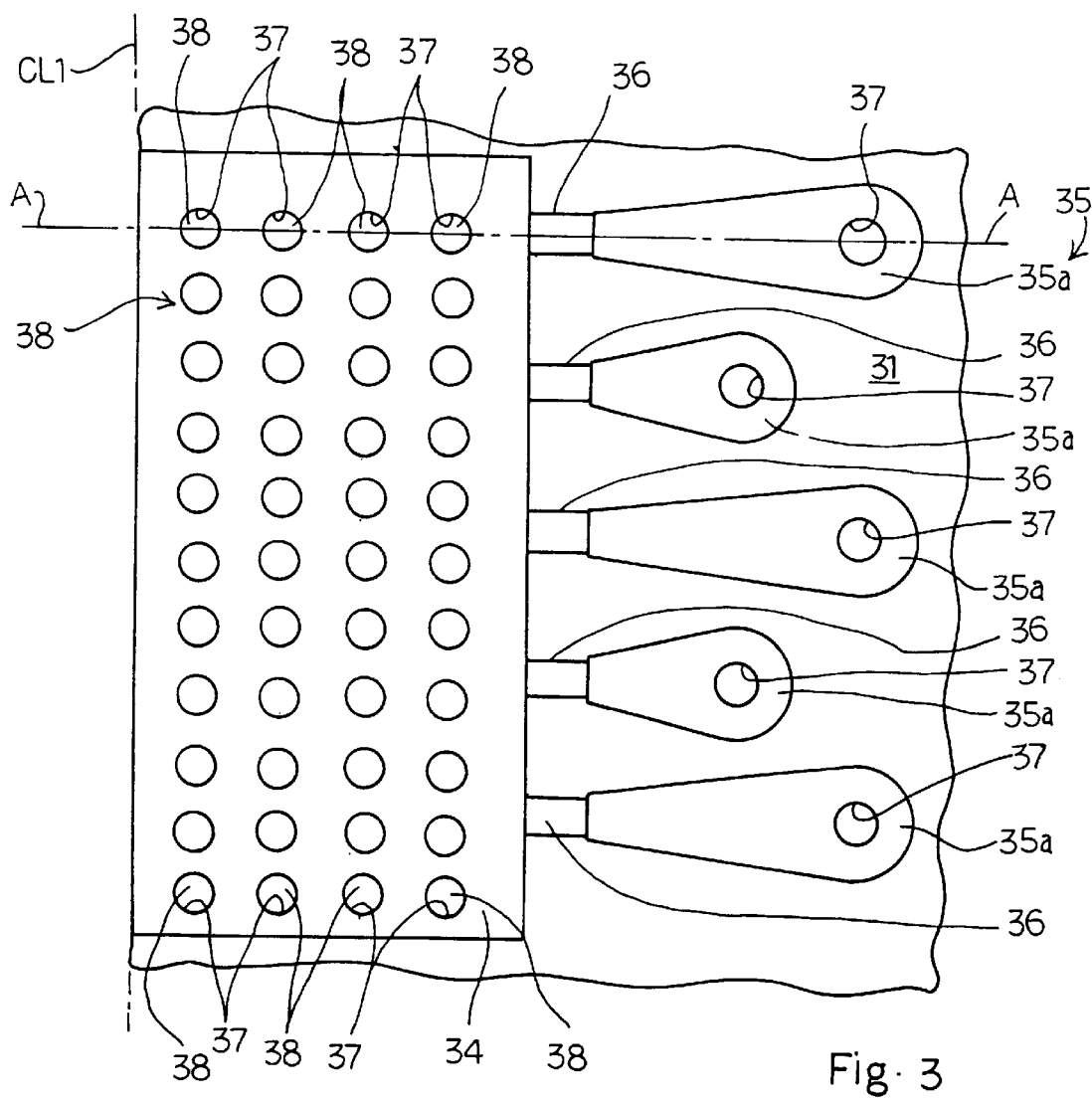
FIG. 3 is a plane view showing a lead frame forming an essential part of a package according to the present invention.
Figure 4:
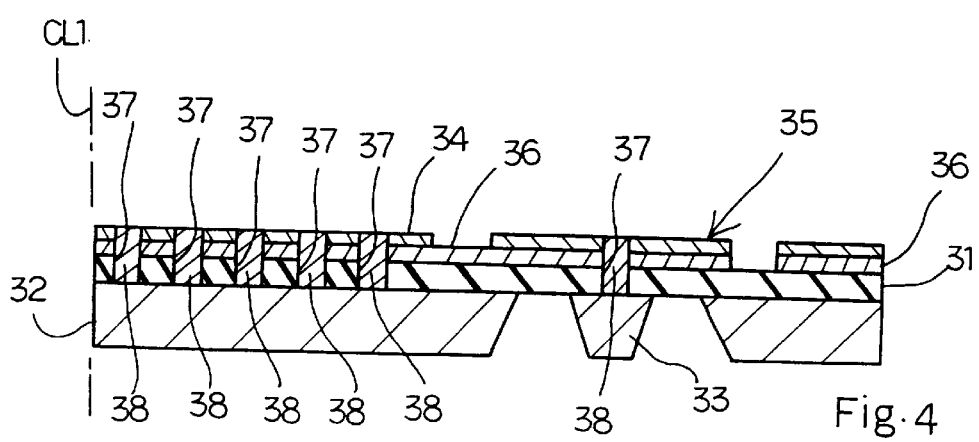
FIG. 4 is a cross sectional view taken along line A—A of FIG. 3 and showing the structure of the lead frame according to the present invention.

Referring to FIGS. 3 and 4, a lead frame comprises an insulating layer 31 of organic compound such as, for example, polyimide, a metallic ground plane 32 and metallic connectors 33 fixed to the reverse surface of the insulating layer 31, and the metallic connectors 33 are connectable to external terminals. The lead frame forms an essential part of a package embodying the present invention, and FIGS. 3 and 4 show a part of the lead frame cut away along a center line CL1.

The lead frame further comprises a metallic island 34 and a conductive pattern 35 formed on a major surface of the insulating layer 31, and the metallic island 34 and the conductive pattern 35 is formed from a conductive metallic foil. The conductive pattern 35 includes conductive strips 35a, and the conductive strips 35a are electrically isolated from one another. The metallic island 34 and the conductive pattern 35 are bonded to the insulating layer 31 by means of a conductive bonding layer 36. Through-holes 37 pass through the metallic island/conductive pattern 34/35, the conductive bonding layer 36 and the insulating layer 31, and conductive metallic plugs 38 fill the through-holes 37, respectively. The conductive metallic plugs 38 electrically connect the metallic island 34 to the metallic ground plane 32 and the conductive pattern 35 is electrically connected through the conductive metallic plugs 38 to the metallic connectors 33. The conductive metallic plugs 38 are formed through a plating technique. The conductive bonding layer 36 provides predetermined resistance against electric current passing therethrough, and serves as end resistors.

Figure 5:
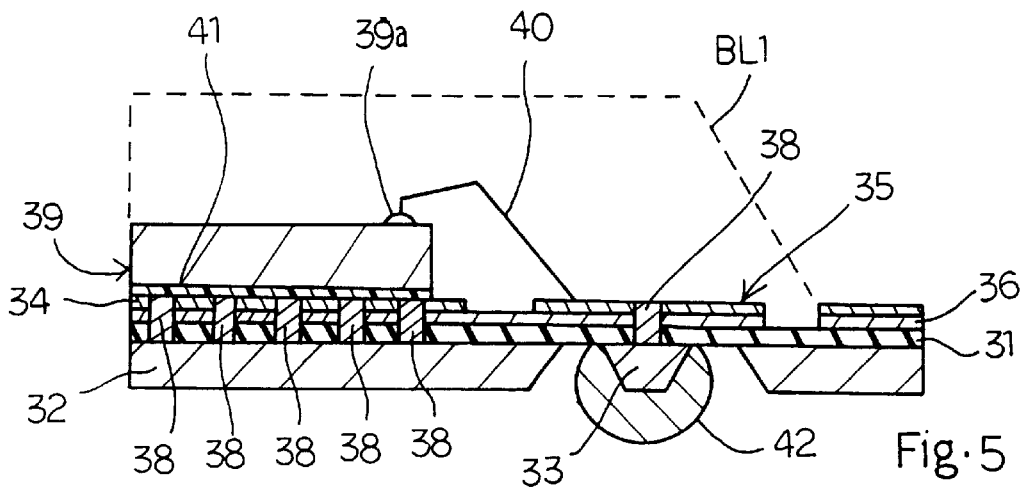
FIG. 5 is a cross sectional view showing a semiconductor chip mounted on the lead frame.
Figure 6:
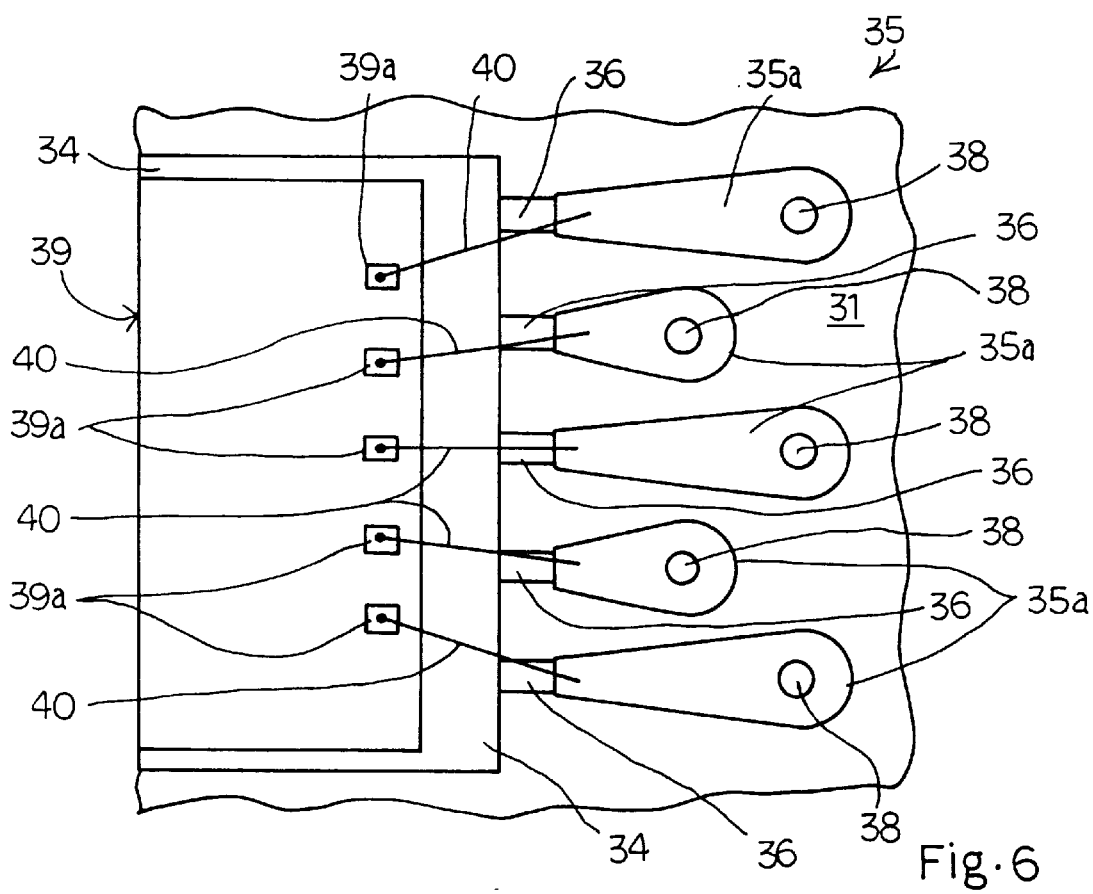
FIG. 6 is a plane view showing the semiconductor chip mounted on the lead frame.

A semiconductor chip 39 is bonded to the metallic island 34, and the conductive strips 35a are selectively connected to the signal pads 39a of the semiconductor chip 39 through conductive wires 40 of gold as shown in FIGS. 5 and 6.

Conductive adhesive organic compound 41 is spread over the metallic island 34, and fixes the semiconductor chip 39 to the metallic island 34. Conductive metallic powder is contained in the organic compound, and makes the organic compound electrically conductive. Silver paste is available for mounting the semiconductor chip 39 on the metallic island 34.

External terminals 42 are attached to the metallic connectors 33, and project from the lower surface of the metallic ground plane 32. The semiconductor chip 39 is sealed in synthetic resin 43 as indicated by broken line BL1. Epoxy resin is an example of the synthetic resin 43. Though now shown in the drawings, an integrated circuit is fabricated on the semiconductor chip 39, and communicates with external devices through the external terminals 42. The lead frame, the piece of synthetic resin 43 and the external terminals 42 form in combination the package embodying the present invention, and the package, the semiconductor chip 39 and the conductive wires 40 as a whole constitute a semiconductor device.

Figure 7:
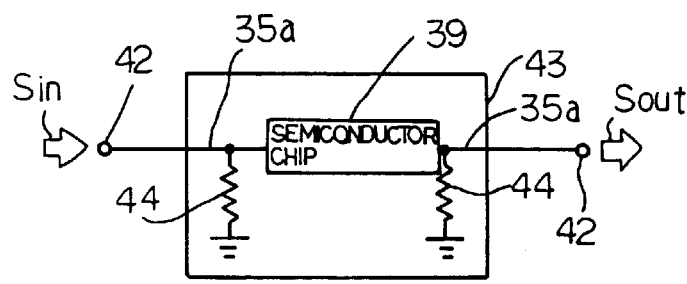
FIG. 7 is a view showing an equivalent circuit of the semiconductor device.

The semiconductor device is equivalent to a circuit shown in FIG. 7. An input signal Sin is supplied to one of the external terminals 42, and an output signal Sout is supplied from another of the external terminals 42, and the conductive bonding layer 36 provides the end resistors 44 between the conductive strips 35a and the metallic ground plane 32. The end resistors 44 are provided immediately before the signal entry into the semiconductor chip 39 and the immediately after the signal delivery from the semiconductor chip 39, and achieve appropriate impedance matching. For this reason, the integrated circuit is effectively prevented from the signal reflection and the waveform distortion.

The lead frame shown in FIGS. 3 and 4 are fabricated as follows. FIGS. 8A to 8I illustrate a process for fabricating the lead frame according to the present invention. The process starts with a four-layered structure 50 shown in FIG. 8A. An insulating layer 51 is laminated on the major surface of a conductive metallic plate 52, and is overlain by a conductive bonding layer 53. A conductive metallic foil 54 is clad over the insulating layer 51 by means of the conductive bonding layer 53.

In this instance, the conductive metallic plate 52 is formed of alloy in a copper system or an aluminum system, and is 0.01 millimeter thick to 0.50 millimeter thick. The thickness of the conductive metallic plate 52 preferably ranges from 0.15 millimeter to 0.2 millimeter. The insulating layer 51 is formed of organic compound in the polyimide system, and is 10 microns thick to 100 microns thick. The conductive bonding layer 53 is expected to strongly adhere the conductive metallic foil 54 to the insulating layer 51. Moreover, it is recommendable to form the conductive bonding layer 53 of conductive material with large resistivity. In this instance, the conductive banding layer 53 is formed of nickel-chromium alloy. Nickel alloy or chromium oxide, which is also strongly adhered to the polyimide, and available for the conductive bonding layer 53. The conductive metallic foil 54 is formed of copper or copper alloy, and is 5 microns thick to 50 microns thick. The thickness of the conductive metallic foil 54 preferably ranges from 23.5 microns to 50 microns.

Figure 8A:
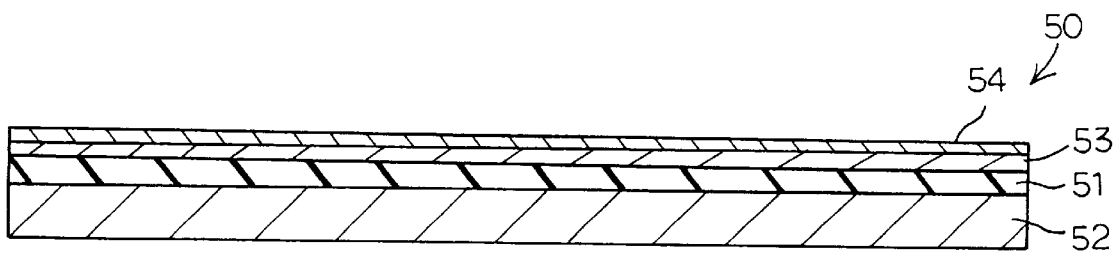
FIGS. 8A to 8I are cross sectional views showing a process of fabricating the lead frame according to the present invention.
Figure 8B:
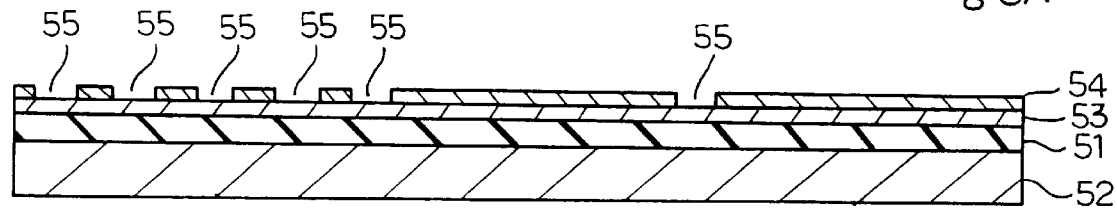
Figure 8C:
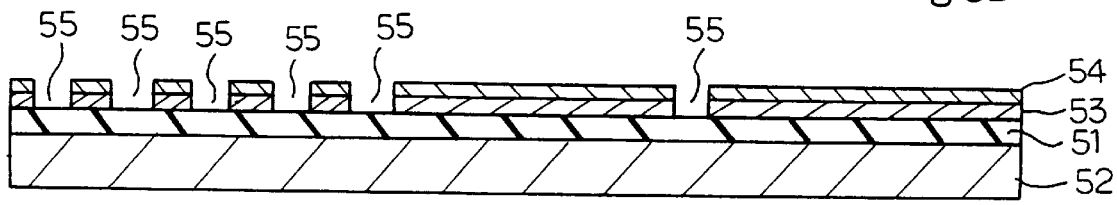
Figure 8D:
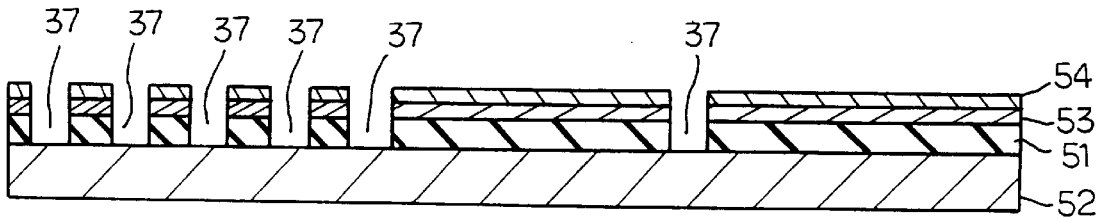

Subsequently, openings are formed in the conductive metallic foil 54 (see FIG. 8B), and the conductive metallic foil 54 serves as a mask for forming the through-holes 37. Using the conductive metallic foil 54 as the mask, the conductive bonding layer 53 is selectively removed as shown in FIG. 8C, and the openings 55 penetrate into the conductive bonding layer 53. Thereafter, the insulating layer 51 is selectively removed, and the openings 55 reach the conductive metallic plate 52. Thus, the through-holes 37 are formed in the four-layered structure as shown in FIG. 8D, and the diameter of the through-holes 37 ranges from 0.05 millimeter to 1.5 millimeters.

Figure 8E:
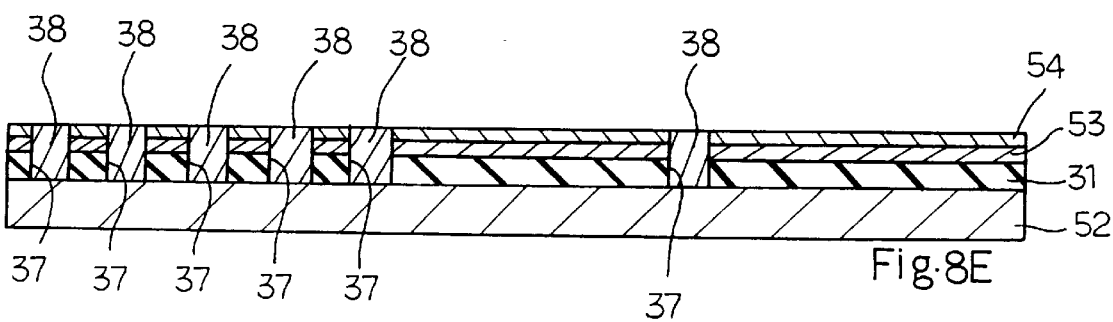

Subsequently, using the conductive metallic plate 52 as an electrode, the conductive material such as copper or copper alloy is grown by using an electroplating. The conductive plugs 38 fill the through-holes 37, respectively, and electrically connect the conductive metallic plate 52 to the conductive metallic foil 54 as shown in FIG. 8E.

Figure 8F:
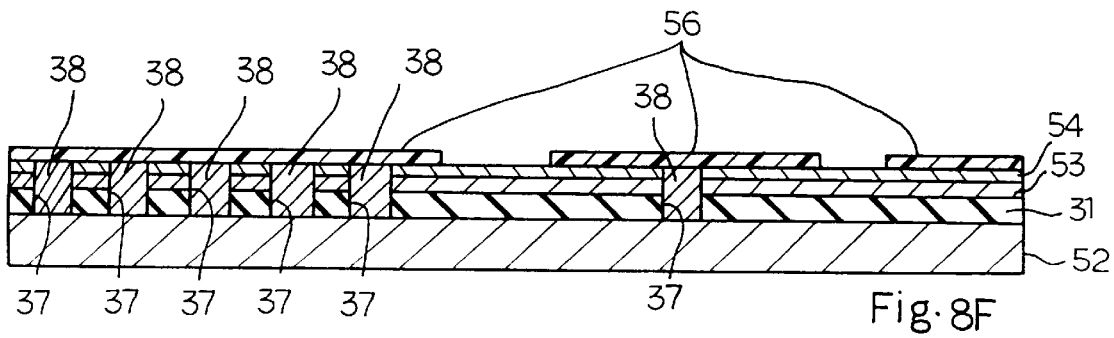

Photo-resist solution is spread over the conductive metallic foil 54, and is baked so as to form a photo-resist layer. A pattern image for the conductive island 34 and the conductive pattern 35 is transferred to the photo-resist layer so as to form a latent image in the photo-resist layer. The latent image is developed, and the photo-resist layer is formed into a photo-resist etching mask 56. Thus, the photo-resist etching mask 56 is provided on the conductive metallic foil 54 through photo-lithographic techniques as shown in FIG. 8F.

Figure 8G:
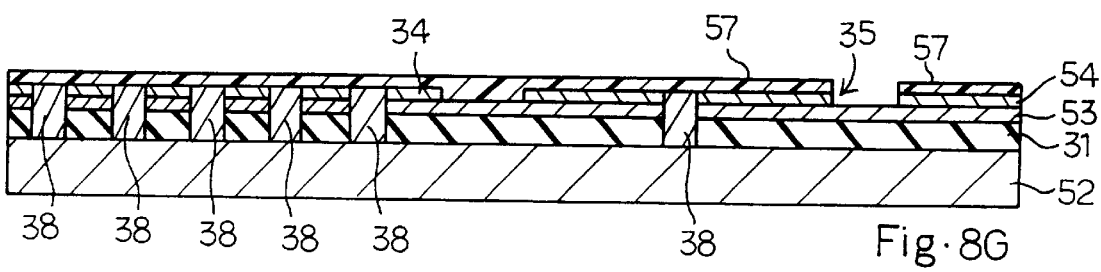

Using the photo-resist etching mask 56, the conductive metallic foil 54 is selectively etched away, and is formed into the conductive island 34 and the conductive pattern 35. The conductive pattern 35 has a micro-strip line structure. The photo-resist etching mask 56 is stripped off, and a photo-resist etching mask 57 is provided on the conductive island 34 and the conductive pattern 35 by using the photo-lithographic techniques as shown in FIG. 8G.

Figure 8H:
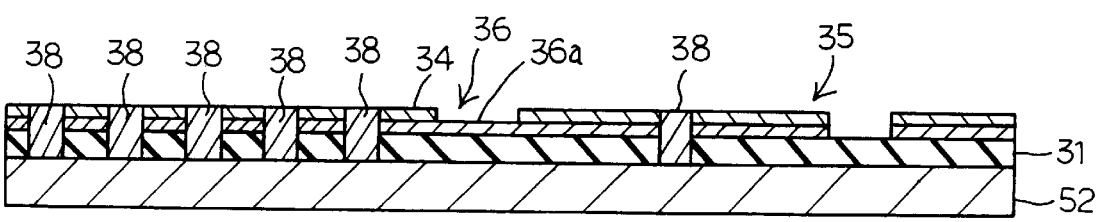

Using the photo-resist etching mask 57, the conductive bonding layer 53 is selectively etched away, and the conductive bonding layer 36 is left between the insulating layer 31 and the conductive island/conductive pattern 34/35 as shown in FIG. 8H. The conductive bonding layer 36 has narrow portions 36a exposed to the gap between the conductive strips 35a and the conductive island 34, and the narrow portions 36a serve as the end resistors 44. The narrow portions 36a are designed to have appropriate resistance for the impedance matching by using H. A. Weeler's equation. In this instance, the narrow portions 36a are 0.1 micron thick, 1 millimeter long and 0.2 micron wide, and each of the narrow portions 36a of nickel chromium alloy provides resistance between 50 ohms to 55 ohms.

Figure 8I:
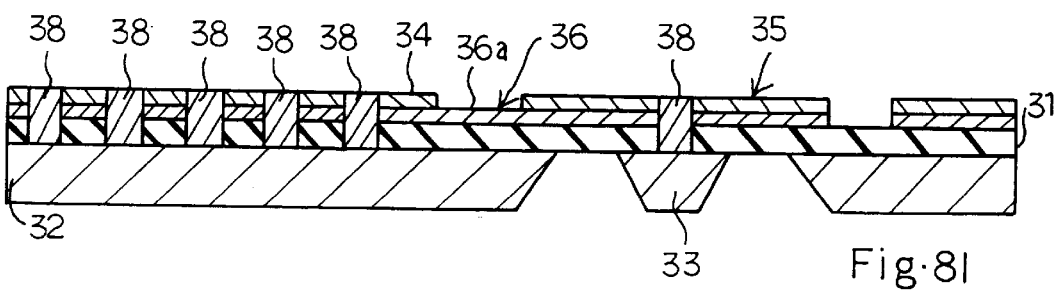

The conductive metallic plate 52 is patterned into the conductive ground plane 32 and the conductive connectors 33 as shown in FIG. 8I, and the lead frame shown in FIGS. 3 and 4 is obtained.

As will be understood from the foregoing description, the conductive bonding layer not only bonds the metallic island 34 and the conductive pattern 35 to the insulating layer 31 but also serves as the end resistors 44. In other words, the manufacturer does not need to independently form the end resistors 44. As a result, the fabrication process according to the present invention is simpler than the prior art process, and the manufacturer reduces the production cost of the semiconductor device.

Moreover, the conductive metallic foil 54 and the conductive bonding layer 53 are patterned into the metallic island/conductive pattern 34/35 and the conductive bonding layer 36 by using the lithographic techniques and the etching technology. As a result, the conductive bonding layer 36 is accurately overlapped with the metallic island/conductive pattern 34/35, and any high accuracy positioning apparatus is never required. This results in reduction of production cost.

Second Embodiment

Figure 9:
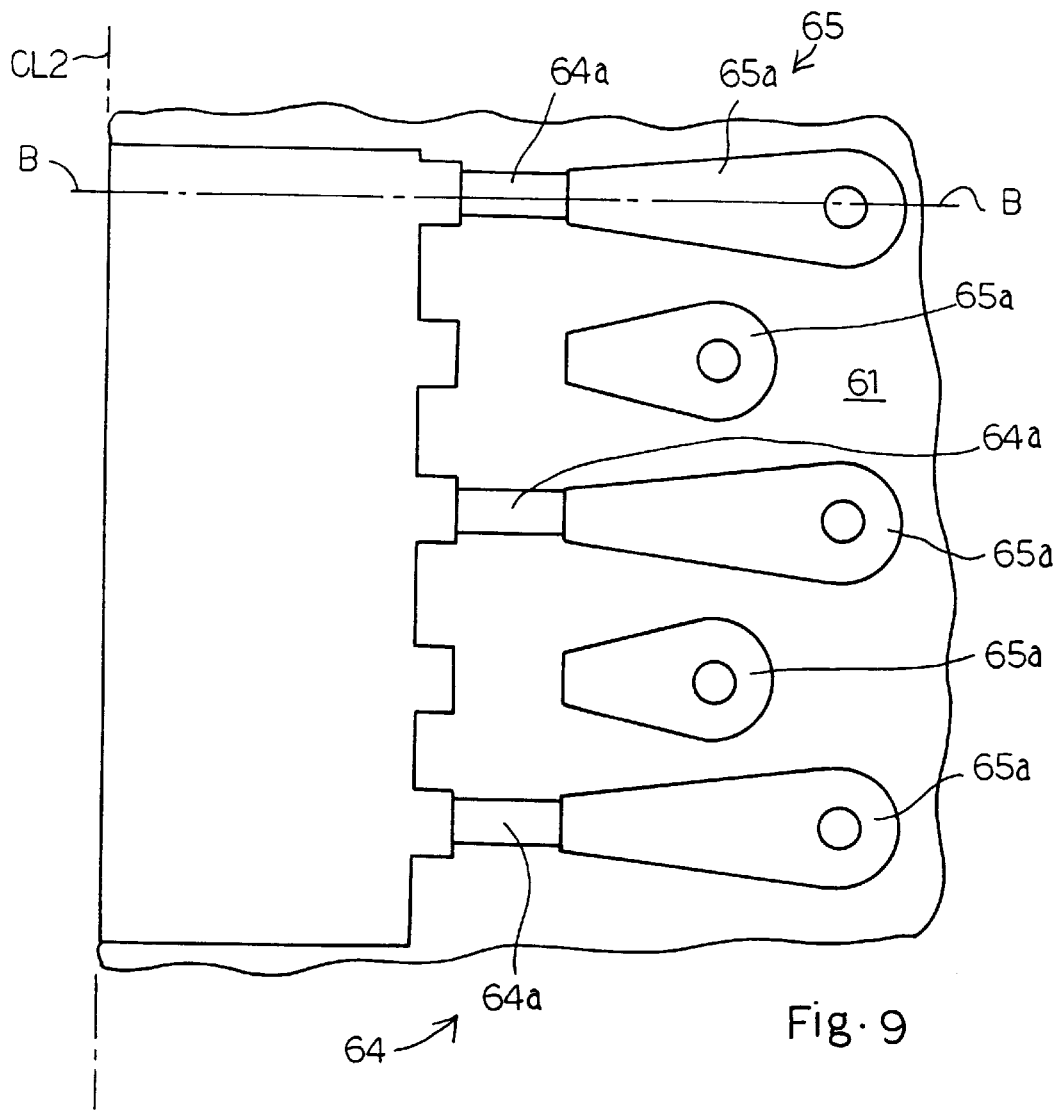
FIG. 9 is a plane view showing the layout of another lead frame according to the present invention.
Figure 10:
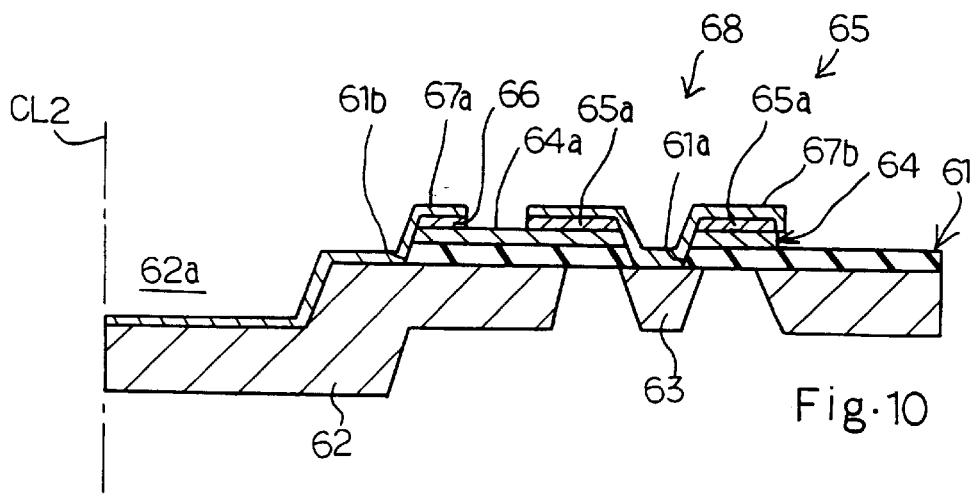
FIG. 10 is a cross sectional view taken along line B—B of FIG. 9 and showing the structure of the lead frame.

FIGS. 9 and 10 illustrate a part of another lead frame forming a part of a package embodying the present invention. The lead frame is cut along a center line CL2. The lead frame comprises an insulating film 61, a conductive ground plane 62 attached to a central area of the reverse surface of the insulating film 61 and connectors 63 attached to a peripheral area of the reverse surface of the insulating film 61. Openings 61a and a central aperture 61b are formed in the insulating film 61, and a cavity 62a is formed in the conductive ground plane 62. The cavity 62a is assigned to a semiconductor chip (not shown in FIGS. 9 and 10). The ground plane 62 is spaced from the connectors 63, and are, accordingly, isolated therefrom.

The lead frame further comprises a conductive bonding layer 64 formed on a major surface of the insulating film 61, a conductive wiring pattern 65 formed on the conductive bonding layer 64, a ground pad 66 formed on the conductive bonding layer 64 and conductive plating layers 67a/67b covering the ground pad/the ground plane 66/62 and the conductive pattern 65. The ground pad 66 encircles the central opening 61b, and spaced from the conductive pattern 65.

Openings are formed in the conductive bonding layer 64, and are aligned with the openings 61a, respectively. The openings of the conductive bonding layer 64 form through-holes 68 together with the openings 61a, and the diameter of the through-holes 68 is 0.05 millimeter to 1.5 millimeters. The conductive pattern 65 has conductive strips 65a, and the conductive bonding layer 64 has narrow portions 64a between the ground pad 66 and selected ones of the conductive strips 65a. The narrow portions 64a serve as end resistors, respectively. The conductive strips 65a are arranged in a micro-strip line structure, and the ground plane 62 is grounded.

The conductive plating layers 67a/67b are formed by using an electroless plating technique and an electroplating technique. The conductive plating layer 67a electrically connects the ground pad 66 to the ground plane 62 and, accordingly, the conductive bonding layer 64 to the ground plane 62. The conductive plating layers 67b electrically connect the conductive strips 65a to the connectors 63, respectively. The conductive plating layers 67b pass through the through-holes 68, respectively, and are held in contact with the associated connectors 63, respectively.

In this instance, the ground plane/the connectors 62/63 are formed of copper alloy or aluminum alloy, and is 0.15 millimeter thick to 0.2 millimeter thick. The insulating film 61 is formed of polyimide resin, and is 10 microns thick to 100 microns thick. The ground pad 66 and the conductive pattern 65 are formed of copper alloy, and is 5 microns thick to 50 microns thick. The conductive bonding layer 64 is formed of nickel alloy or chromium oxide. If the narrow portion 64a of nickel-chromium alloy are 0.1 micron thick, 1 millimeter long and 0.2 micron wide, the end resistor achieves 50 ohms to 55 ohms. The end resistors may be regulated to 50 ohms for impedance matching.

Figure 11:
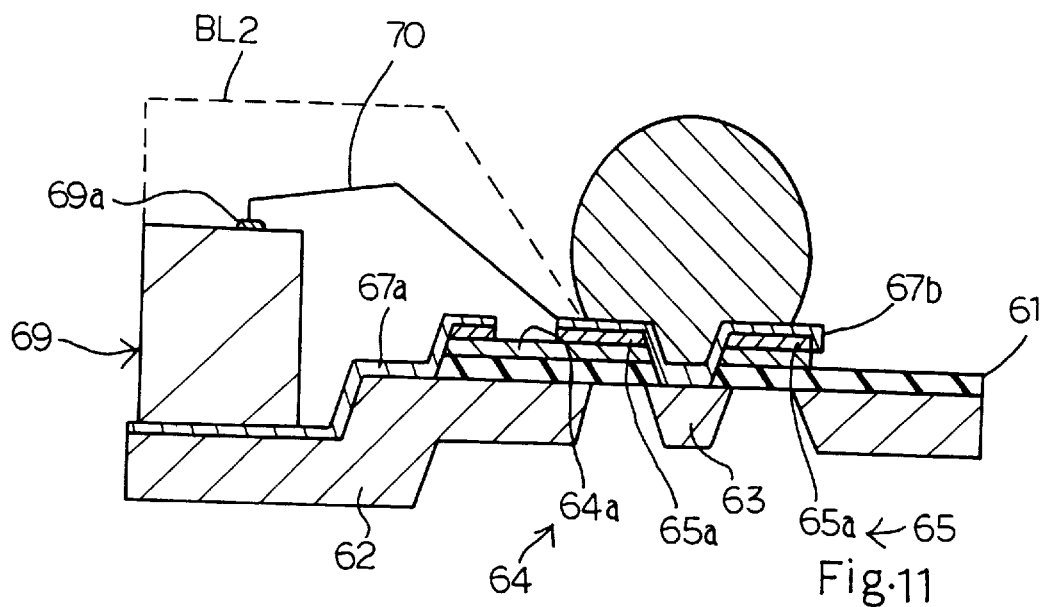
FIG. 11 is a cross sectional view showing the structure of a semiconductor device with built-in end resistors.
Figure 12:
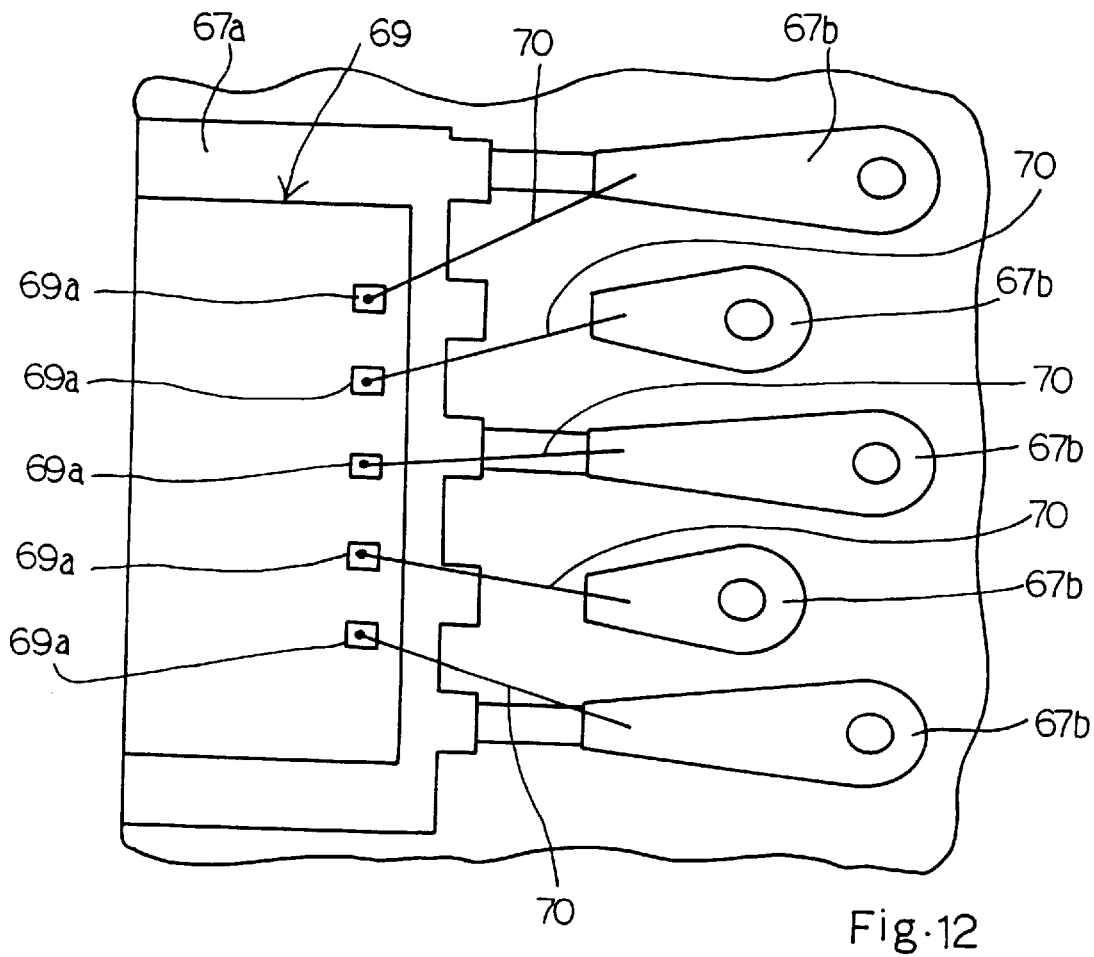
FIG. 12 is a plane view showing the layout of the semiconductor device.

Using the lead frame shown in FIGS. 9 and 10, a semiconductor device is fabricated as follows. FIGS. 11 and 12 illustrate a semiconductor device with built-in end resistors. A semiconductor chip 69 is mounted on the conductive plating layer 67a, and silver paste bonds the semiconductor chip 69 to the conductive plating layer 67a. Gold wires 70 connect bonding pads 69a to the conductive plating layers 67b, respectively. An integrated circuit is incorporated in the semiconductor chip 69, and is electrically connected through the gold wires 70 to the conductive plating layers 67b. The semiconductor chip 69 mounted on the lead frame is sealed in synthetic resin such as, for example, thermo-setting epoxy resin, and the outline of the synthetic resin piece is indicated by broken line BL2.

FIGS. 13A to 13H illustrate a process for fabricating the lead frame according to the present invention. The process starts with preparation of a four-layered structure, and a conductive metallic plate 73, an insulating layer 74, a conductive bonding layer 75 and a conductive metallic foil 76 form in combination the four-layered structure. The conductive metallic plate 73 is formed of copper alloy or aluminum alloy, and is 0.15 micron thick to 0.2 micron thick. The insulating layer 74 is formed of polyimide, and is 10 microns to 100 microns thick. The conductive metallic foil 76 is formed of copper, and is 5 microns thick to 50 microns thick.

Figure 13A:
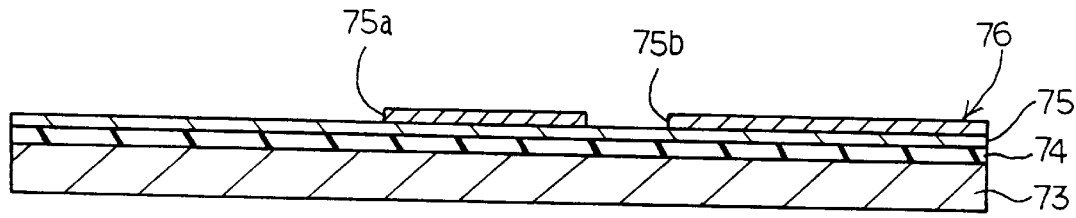
FIG. 13A to 13H are cross sectional views showing a process for fabricating the lead frame shown in FIGS. 9 and 10.
Figure 13B:
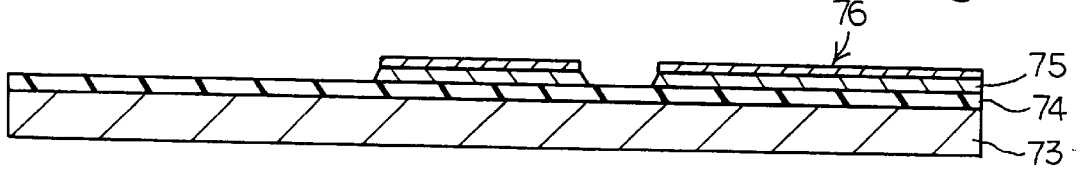
Figure 13C:
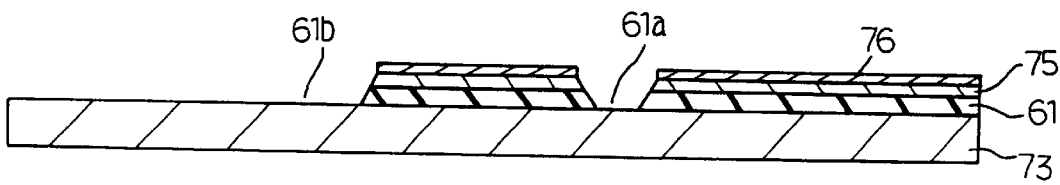

First, the openings 75a/75b are formed in the conductive metallic foil 75 as shown in FIG. 13A, and define the central aperture 61b and the openings 61a, respectively. Using the patterned conductive metallic foil 75 as a mask, the conductive bonding layer 75 is selectively removed as shown in FIG. 13B, and, thereafter, the insulating layer 74 is selectively removed as shown in FIG. 13C. The insulating layer 74 is formed into the insulating layer 61, and the conductive metallic plate 73 is exposed to the through-holes 61a and the central aperture 61b.

Figure 13D:
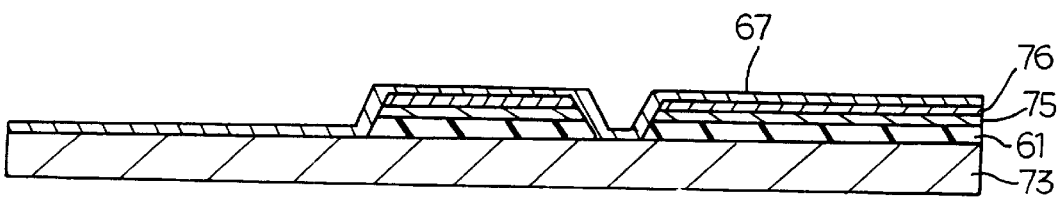

A conductive metallic layer 67 is grown on the resultant structure by using the electroless plating and, thereafter, the electroplating, and electrically connects the conductive metallic foil 76 to the conductive metallic plate 73 as shown in FIG. 13D.

Figure 13E:
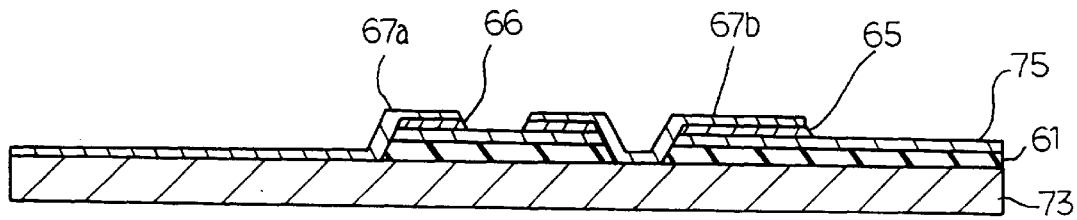

A photo-resist etching mask (not shown) is patterned on the conductive metallic layer 67, and the conductive metallic layer 67 and the conductive metallic foil are selectively etched away. Upon completion of the etching, the conductive metallic foil 76 is formed into the ground pad 66 and the conductive pattern 65 as shown in FIG. 13E.

Figure 13F:
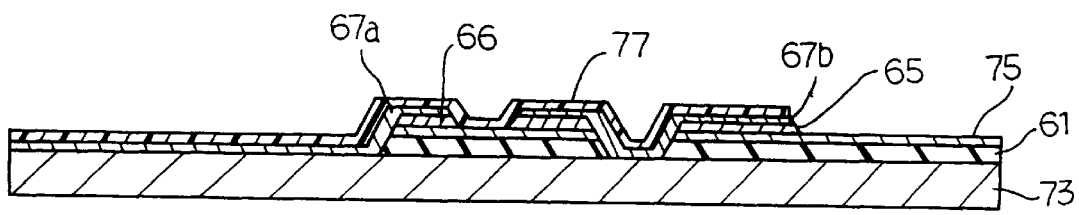
Figure 13G:
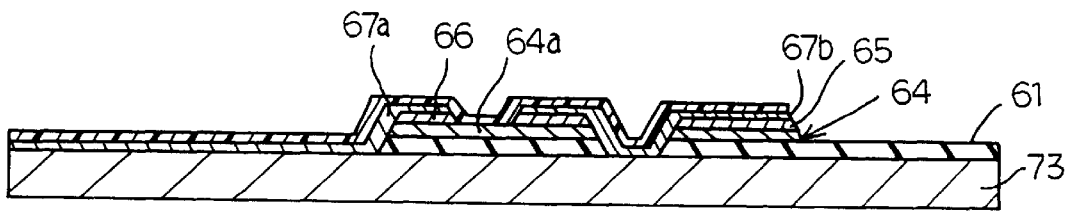

The photo-resist etching mask is stripped off, and a new photo-resist etching mask 77 is provided on the resultant structure by using the photo-lithographic techniques as shown in FIG. 13F. The conductive bonding layer 75 is selectively etched away, and is formed into the conductive bonding layer 64 as shown in FIG. 13G. The photo-resist etching mask 77 is stripped off.

Figure 13H:
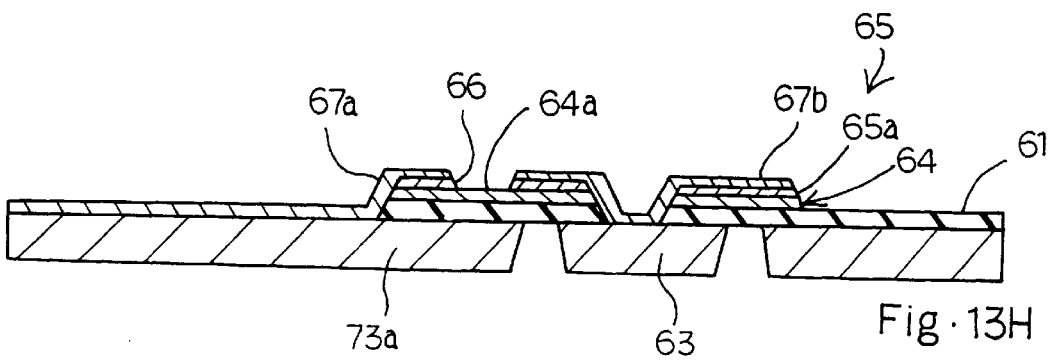

Finally, the conductive metallic plate 73 is selectively removed, and is formed into a conductive plane 73a and the connectors 63 as shown in FIG. 13H. The ground plane 62 is formed from the conductive plane 73a.

The semiconductor device achieves all the advantages of the first embodiment, and the production cost is also reduced through the process shown in FIGS. 13A to 13H.

Third Embodiment

Figure 14:
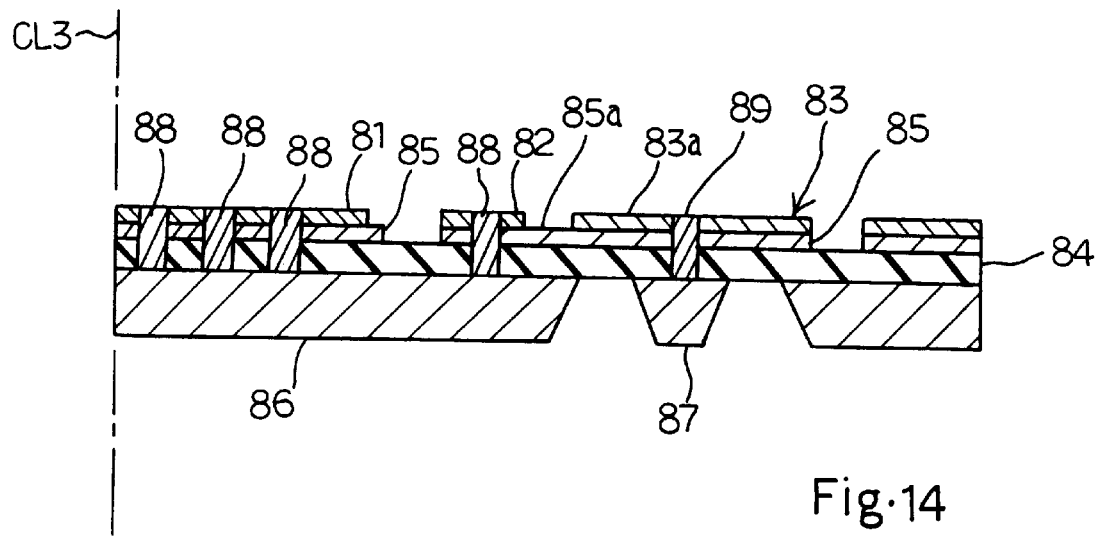
FIG. 14 is a cross sectional view showing the structure of yet another lead frame according to the present invention.

FIG. 14 illustrates a lead frame forming a part of yet another package embodying the present invention. The lead frame is cut along a center line CL3, and only half of the lead frame is shown. The lead frame has a four-layered structure. A conductive island 81, ground pads 82 and a conductive pattern 83 are bonded to a major surface of an insulating layer 84 by means of conductive bonding layers 85, and a ground plane 86 and connectors 87 are bonded to the reverse surface of the insulating layer 84.

The conductive island 81, the ground pads 82 and the conductive pattern 83 are formed from a conductive metallic foil, and the ground plane 86 and the connectors 87 are patterned from a conductive metallic plate. The conductive metallic plate is formed of copper alloy or aluminum alloy, and is 0.15 millimeter thick to 0.2 millimeter thick. The insulating layer 84 is formed of polyimide resin, and is 10 microns thick to 100 microns thick. The conductive metallic foil is formed of copper or copper alloy, and is 5 microns thick to 50 microns thick. The conductive bonding layer 85 is formed of nickel alloy or chromium oxide, which is appropriate for bonding the conductive metallic foil to the insulating layer of polyimide. The conductive bonding layer 85 is large in resistivity.

Plural conductive strips 83*a* form the conductive pattern 83, and the ground pads 82 are spaced from the conductive strips 83*a*. As a result, the conductive bonding layer 85 is partially exposed to the gaps between the ground pads 82 and the conductive strips 83*a*, and serves as end resistors 85*a*. When the conductive bonding layer 85 is formed of nickel-chromium alloy, the end resistor 85*a* is designed to be 0.1 micron thick, 1 millimeter long and 0.2 millimeter wide so as to provide 50 ohms to 55 ohms. The end resistors 85*a* may be regulated to 50 ohms for an impedance matching.

The lead frame is fabricated through a process similar to that of the first embodiment, and description is omitted. The ground potential is applied to the ground plane 86, and the conductive pattern 83 has the micro-stripe line structure.

Through-holes are open to the conductive island/the ground pads 81/82 and the ground plane 86, and are plugged with conductive pieces 88. The diameter of the through-holes is 0.05 millimeter to 1.5 millimeter. The conductive pieces 88 are grown through electroplating, and the conductive island 81 and the ground pads 82 are electrically connected through the conductive pieces 88 to the ground plane 86. Through-holes are further formed for the conductive pattern 83, and are open to the conductive strips 83*a* and the connectors 87. The through-holes are also plugged with conductive pieces 89, and the conductive strips 83*a* are electrically connected through the conductive pieces 89 to the associated connectors 87, respectively.

Figure 15:
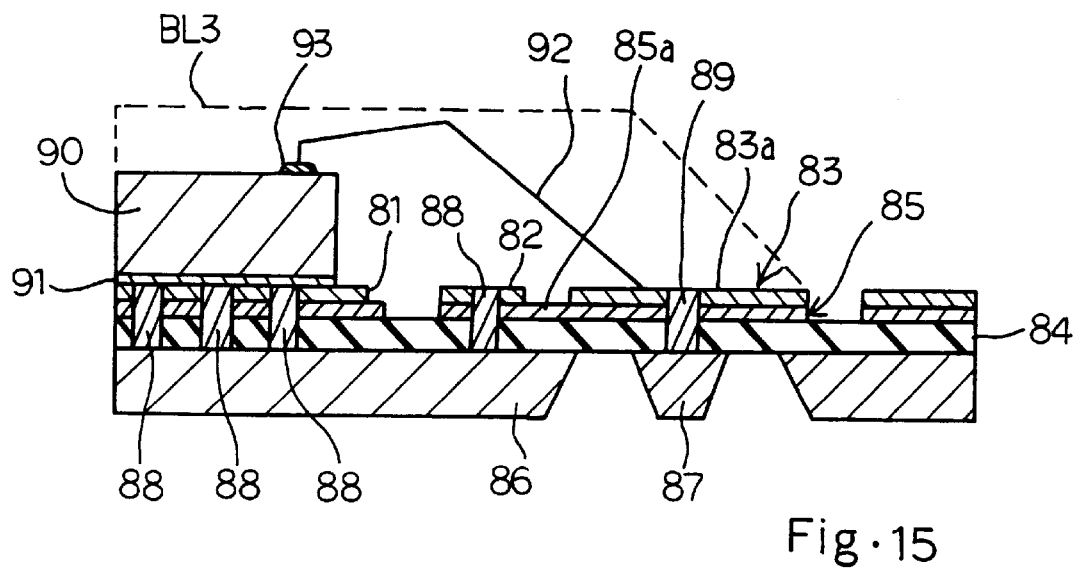
FIG. 15 is a cross sectional view showing the structure of a semiconductor device using the lead frame.
Figure 16:
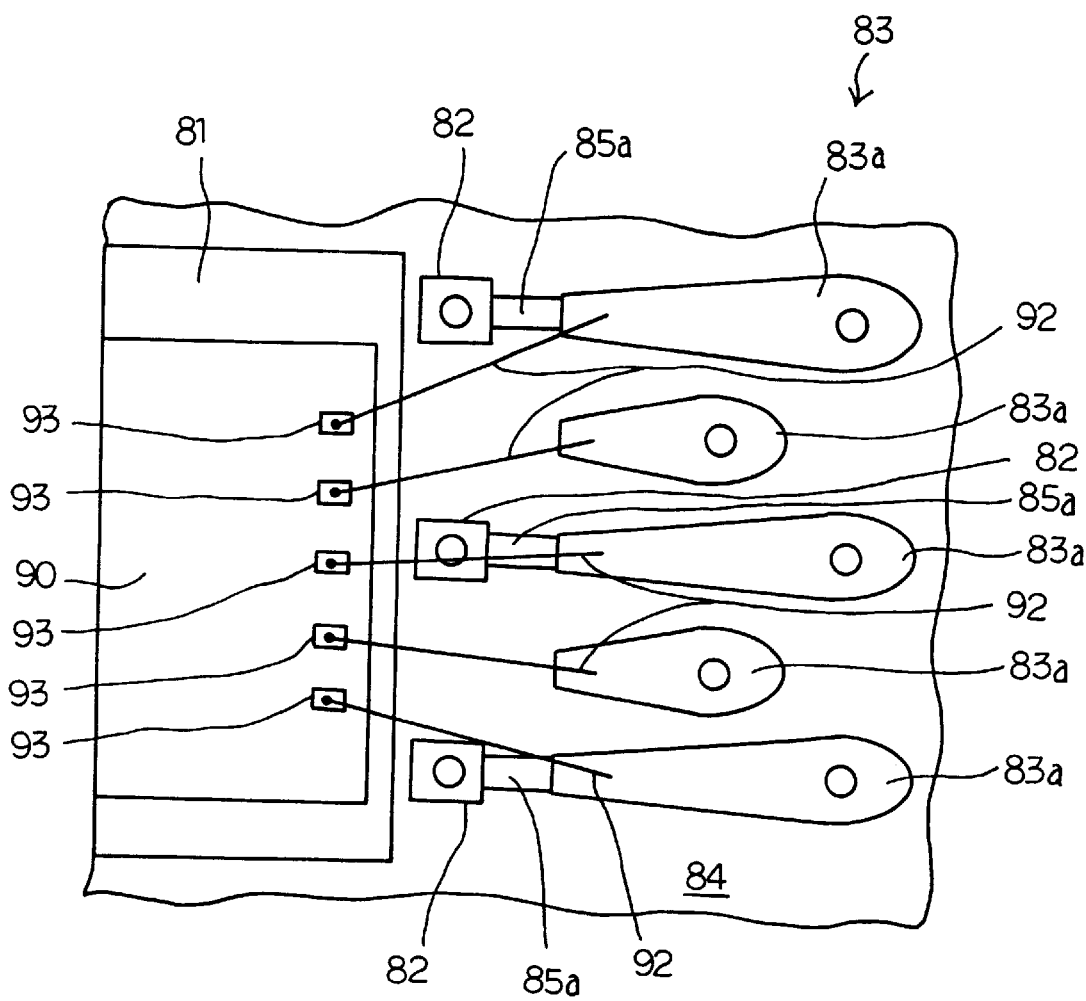
FIG. 16 is a plane view showing the layout of a conductive pattern on the lead flame.

Using the lead frame, a semiconductor device is fabricated as follows. FIGS. 15 and 16 illustrate the semiconductor chip, and a sealing resin piece is removed from the semiconductor device for better understanding. A semiconductor chip 90 is bonded to the conductive island 81 by means of silver paste 91, and gold wires 92 connect bonding pads 93 of the semiconductor chip 90 to the conductive strips 83*a*. The semiconductor chip 90 and the gold wires 92 are sealed in synthetic resin, the outline of which is indicated by broken line BL3.

Figure 17:
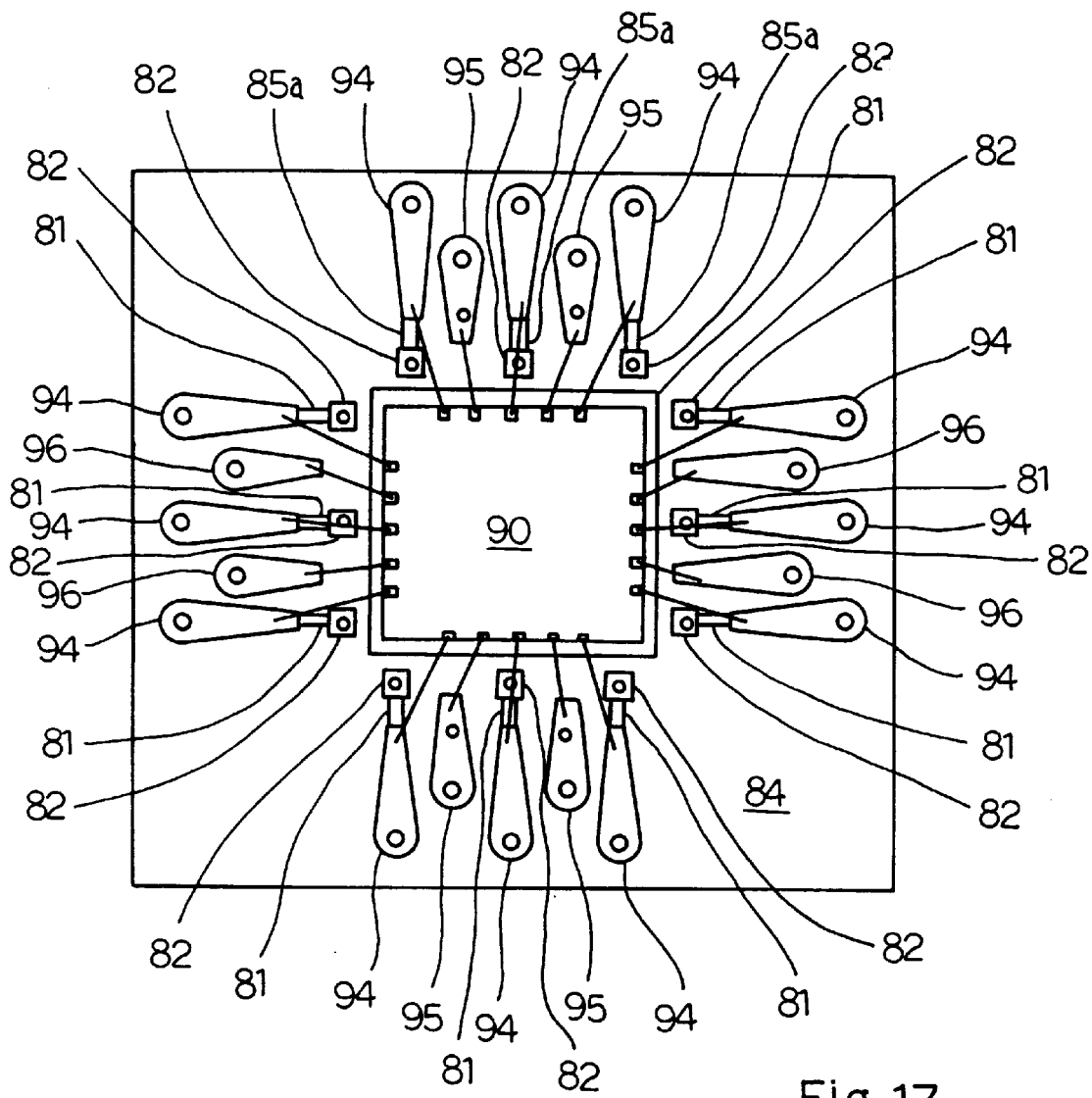
FIG. 17 is a plane view showing the layout of the semiconductor device.

FIG. 17 illustrates a modification of the lead frame shown in FIG. 14. The conductive strips are broken down into three groups 94, 95 and 96. The first group 94 is assigned to external signals, the second group 95 is assigned to the ground potential, and the third group 96 is assigned to a power voltage. Each of the conductive strips of the second group 95 is connected through two through-holes to a connector on the reverse surface of the insulating layer 84, and each conductive strip of the third group 96 is connected through a single through-hole to another connector. The conductive strip of the first group 94 is connected through the end resistor 85*a* to the ground pad 82.

As will be appreciated from the foregoing description, the semiconductor device according to the present invention has the built-in end resistors accurately adjusted to a target resistance, and the end resistor achieve good impedance matching. Moreover, the conductive strips are formed in the micro-strip line structure, and make the characteristic impedance stable.

Moreover, the end resistors are patterned through the lithographic techniques and the etching. The lithography and the etching are economical, and reduce the production cost of the semiconductor device.

Although particular embodiments of the present invention have been shown and described, it will be obvious to those skilled in the art that various changes and modifications may be made without departing from the spirit and scope of the present invention.

What is claimed is:

1. A package used for a semiconductor device, comprising:
    an insulating layer having a first surface and a second surface opposite to said first surface;
    a conductive island formed over said first surface;
    a conductive pattern formed over said first surface, spaced from said conductive island, and having at least one conductive strip assigned to an electric signal;
    a conductive bonding layer provided between said first surface and said conductive pattern for bonding said conductive pattern to said insulating layer, and having a portion connected between said at least one conductive strip and a constant potential source so as to serve as an end resistor;
    a ground plane fixed to said second surface, and applied with a constant potential;
    at least one connector fixed to said second surface, and spaced from said ground plane; and
    conductive plugs respectively formed in through-holes, and connected between said conductive island and said ground plane and between said at least one conductive strip and said at least one connector.

2. The package as set forth in claim 1, in which said constant potential source has said constant potential.

3. The package as set forth in claim 2, in which said ground plane serves as said constant potential source.

4. The package as set forth in claim 3, in which said constant potential is a ground potential.

5. The package as set forth in claim 1, in which said conductive island is assigned to a semiconductor chip having at least one pad electrode electrically connected to said at least one conductive strip.

6. The package as set forth in claim 1, further comprising at least one ground pad formed on said portion of said conductive bonding layer and spaced from said at least one conductive strip.

7. The package as set forth in claim 6, in which said at least one ground pad is connected through another conductive plug in another through-hole to said ground plane.

8. The package as set forth in claim 7, in which a semiconductor chip is mounted on said conductive island.

9. The package as set forth in claim 8, in which said conductive pattern further includes another conductive strip connected through yet another conductive plug in yet another through-hole to said ground plane and through still another conductive plug in still another through-hole to another connector and electrically connected to another pad electrode of said semiconductor chip.

10. The package as set forth in claim 8, in which said conductive pattern further includes another conductive strip connected through yet another conductive plug in yet another through-hole to another connector applied with a power voltage and electrically connected to another pad electrode of said semiconductor chip.

11. A package used for a semiconductor device, comprising:
    an insulating layer having a first surface and a second surface opposite to said first surface;
    a conductive island;
    a conductive pattern formed over said first surface, spaced from said conductive island, and having at least one conductive strip assigned to an electric signal;
    a conductive bonding layer provided between said first surface and said conductive pattern for bonding said conductive pattern to said insulating layer, and having a portion connected between said at least one conductive strip and a constant potential source so as to serve as an end resistor;

a ground plane applied with a constant potential; and at least one connector fixed to said second surface, and spaced from said ground plane;

wherein said insulating layer has an aperture, and said aperture is closed by said conductive island and said ground plane held in contact with each other in said aperture.

12. The package as set forth in claim 11, further comprising a ground pad located around said aperture and inserted between said conductive bonding layer and said conductive island.

13. The package as set forth in claim 12, in which a semiconductor chip is mounted on said conductive island, and a pad electrode of said semiconductor chip is electrically connected to said at least one conductive strip.

* * * * *